United States Patent
Yoon et al.

(10) Patent No.: US 10,256,226 B2
(45) Date of Patent: Apr. 9, 2019

(54) DISPLAY DEVICE INCLUDING ELECTROSTATIC DISCHARGE CIRCUIT

(71) Applicant: Samsung Display Co., Ltd., Yongin-si (KR)

(72) Inventors: Yeo Geon Yoon, Suwon-si (KR); Hyung Gi Jung, Cheonan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 22 days.

(21) Appl. No.: 15/672,746

(22) Filed: Aug. 9, 2017

(65) Prior Publication Data
US 2017/0338220 A1    Nov. 23, 2017

Related U.S. Application Data

(62) Division of application No. 14/264,870, filed on Apr. 29, 2014, now Pat. No. 9,761,578.

(30) Foreign Application Priority Data

Oct. 25, 2013    (KR) .......................... 10-2013-0128083

(51) Int. Cl.
*H01L 27/02*    (2006.01)
*H01L 27/12*    (2006.01)

(52) U.S. Cl.
CPC ...... *H01L 27/0255* (2013.01); *H01L 27/0288* (2013.01); *H01L 27/124* (2013.01); *H01L 27/1214* (2013.01)

(58) Field of Classification Search
CPC .......... H01L 27/0248; H01L 27/0255; H01L 27/0288; H01L 27/0292; H01L 27/124
See application file for complete search history.

(56) References Cited

U.S. PATENT DOCUMENTS 7,009,254 B2    3/2006    Nagasawa et al.
7,470,942 B2    12/2008    Chen
(Continued)

FOREIGN PATENT DOCUMENTS

JP    4938735    2/2012
KR    10-2010-0100213    9/2010

OTHER PUBLICATIONS

Non-Final Office Action dated Jun. 10, 2015, in U.S. Appl. No. 14/264,870.
(Continued)

*Primary Examiner* — David C Spalla
(74) *Attorney, Agent, or Firm* — H.C. Park & Associates, PLC

(57) ABSTRACT

The present invention relates to a display device including a static electricity discharge circuit. The display device according to an exemplary embodiment of the present invention includes: a thin film transistor array panel including a display area including a plurality of pixels and a peripheral area around the display area; a signal wire positioned at the peripheral area; and a static electricity discharge circuit unit positioned at the peripheral area and connected to the signal wire, wherein the static electricity discharge circuit unit includes a first portion and a second portion positioned at a same layer as a portion of the signal wire and facing each other with a separation space therebetween, and a connecting member positioned at a different layer from the first portion and the second portion and electrically connecting the first portion and the second portion.

7 Claims, 12 Drawing Sheets

(56) References Cited

U.S. PATENT DOCUMENTS

| | | |
|---|---|---|
| 7,920,219 B2 | 4/2011 | Jun et al. |
| 8,085,352 B2 | 12/2011 | Kim et al. |
| 8,228,273 B2 | 7/2012 | Tsubata |
| 8,350,977 B2 | 1/2013 | Jung et al. |
| 2007/0029615 A1* | 2/2007 | Lai .................... G02F 1/136204 257/355 |
| 2008/0135846 A1* | 6/2008 | Shin .................... H01L 27/0248 257/59 |
| 2010/0225621 A1 | 9/2010 | Jung et al. |
| 2011/0096449 A1 | 4/2011 | Lee et al. |

OTHER PUBLICATIONS

Final Office Action dated Dec. 22, 2015, in U.S. Appl. No. 14/264,870.
Advisory Action dated Mar. 25, 2016, in U.S. Appl. No. 14/264,370.
Non-Final Office Action dated Dec. 30, 2016, in U.S. Appl. No. 14/264,870.
Notice of Allowance dated May 16, 2017, in U.S. Appl. No. 14/264,870.

* cited by examiner

DISPLAY DEVICE INCLUDING ELECTROSTATIC DISCHARGE CIRCUIT

CROSS REFERENCE TO RELATED APPLICATION

This application is a Divisional of U.S. patent application Ser. No. 14/264,870, filed on Apr. 29, 2014, and claims priority from and the benefit of Korean Patent Application No. 10-2013-0128083, filed on Oct. 25, 2013, which is hereby incorporated by reference for all purposes as if fully set forth herein.

BACKGROUND

Field

Exemplary embodiments of the present invention relate to a display device including a static electricity discharge circuit.

Discussion of the Background

A display device typically includes a display panel for displaying an image and various driving devices to drive the display panel.

The display panel may include a plurality of pixels and a plurality of display signal lines connected thereto. Each display signal line may include a gate line transmitting a gate signal and a data line transmitting a data signal.

Each pixel may include at least one switching element connected to the display signal line, at least one pixel electrode connected to the switching element, and an opposed electrode facing the pixel electrode and applied with a common voltage. The switching element may include at least one thin film transistor, and the switching element is turned on or turned off according to the gate signal transmitted by the gate line. This configuration of the switching element is such that the data voltage transmitted by the data line may be selectively transmitted to the pixel electrode. The pixel electrode may be connected to a storage capacitor applied with the common voltage Vcst so as to maintain the charged voltage until a subsequent data voltage is applied after the switching element is turned off.

Wires transmitting various voltages for the driving of the display panel are disposed in a peripheral area of the display panel. For example, a storage signal wire transmitting the storage common voltage Vcst may be disposed in the peripheral area of the display panel.

The driving device includes a gate driver outputting a gate-on voltage and a gate-off voltage to the gate line to turn-on and turn-off the switching element, and a data driver outputting the data voltage to the data line to apply the data voltage to the pixel via the switching element when the switching element is turned on.

The gate driver and the data driver may be mounted on the display panel as chip types. However, to reduce a size of the display device and to improve productivity, the gate driver in particular may be integrated in the display panel by forming the gate driver and the switching element during the same process. The gate driver may include a plurality of gate driving circuits, functioning substantially as shift registers, connected to each other and arranged in a line, and wires transmitting various signals input to the gate driving circuits. The gate driving circuit may include a plurality of thin film transistors and a plurality of capacitors. The gate driving circuit is connected to the gate line to transmit the gate signal.

In the display device described above, static electricity may flow to the inner circuit of the display panel by friction generated during the manufacturing of the display panel or in a test process such as a visual test of the display panel. The flowed static electricity may damage the various electrical elements formed in the display panel. Particularly, in the display device in which the gate driving circuit is integrated in the display panel, when the wires near the gate driving circuit intersect and are disposed closely to each other, the static electricity may damage elements such as the wires or the thin film transistors.

The above information disclosed in this Background section is only for enhancement of understanding of the background of the invention and therefore it may contain information that does not form the prior art that is already known in this country to a person of ordinary skill in the art.

SUMMARY

Exemplary embodiments of the present invention reduce a defect of wires or nearby electrical elements positioned in a peripheral area of a display panel due to static electricity by blocking static electricity from flowing into the wires positioned at the peripheral area of the display panel or by dispersing the flowed static electricity.

An exemplary embodiment of the present invention discloses a display device including a thin film transistor array panel that includes a display area including a plurality of pixels and a peripheral area around the display area, a signal wire positioned at the peripheral area, and a static electricity discharge circuit unit positioned at the peripheral area and connected to the signal wire. Further, in the display device, the static electricity discharge circuit unit includes a first portion and a second portion that are positioned at a same layer respectively as a portion of the signal wire and face each other with a separation space therebetween, and a connecting member positioned at a different layer from the first portion and the second portion and electrically connecting the first portion and the second portion.

An exemplary embodiment of the present invention also discloses a display device including a thin film transistor array panel including a display area including a plurality of pixels and a peripheral area around the display area, a signal wire positioned at the peripheral area, and a static electricity discharge circuit unit positioned at the peripheral area and connected to the signal wire. Further in the display device including a thin film transistor array panel, the static electricity discharge circuit unit includes a plurality of first static electricity discharge diodes connected to the signal wire, and a first shorting bar connected to the plurality of first static electricity discharge diodes.

According to an exemplary embodiment of the present invention, the static electricity that may flow into wires positioned at the peripheral area of the display panel may be prevented or dispersed/reduced such that defects of the wires positioned at the peripheral area of the display panel or nearby electrical elements caused by the static electricity may be reduced.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
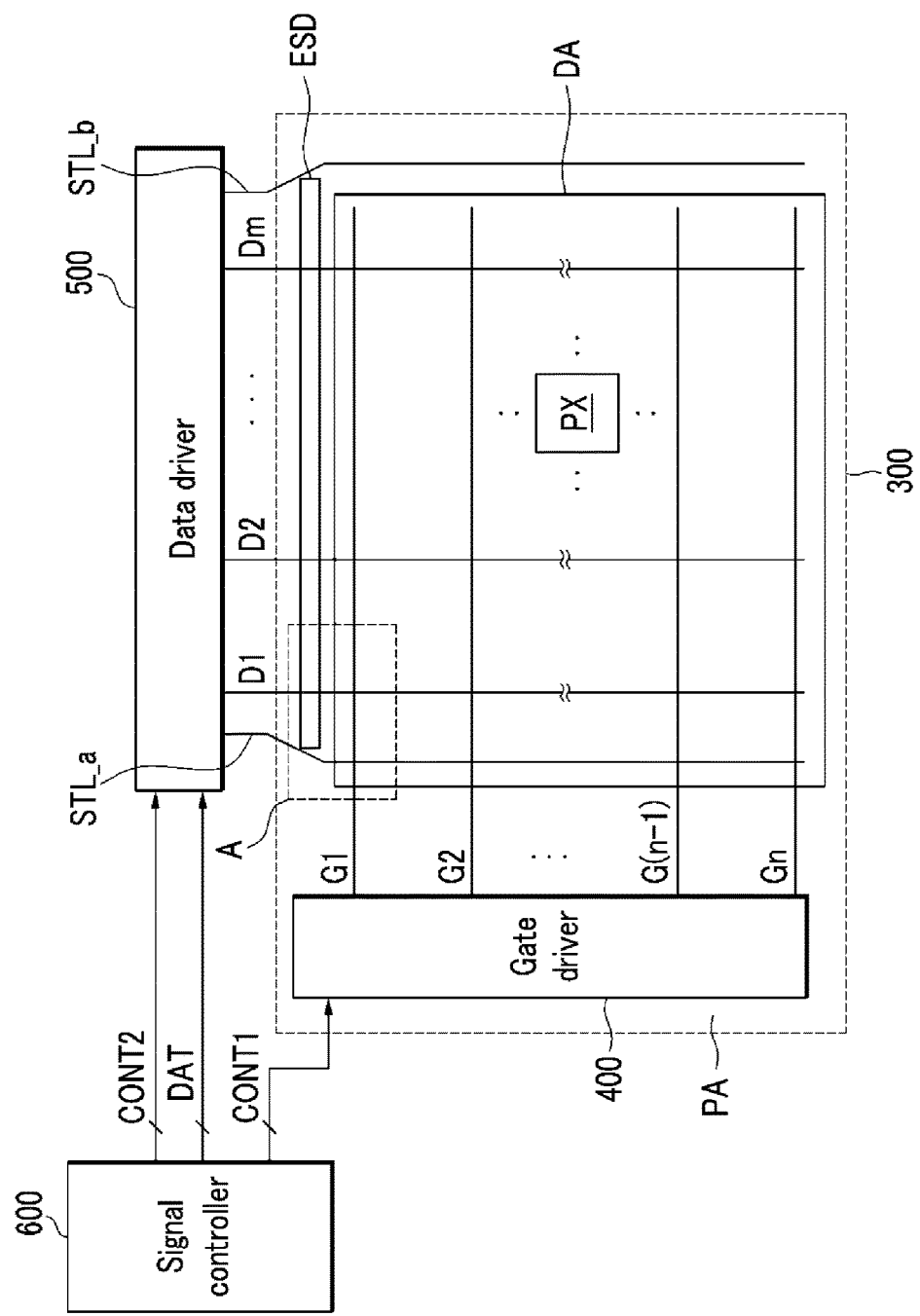
FIG. 1 is a block diagram of a display device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Throughout this specification and the claims that follow, when it is described that an element is "coupled" or "connected" to another element, the element may be "directly coupled" or "directly connected" to the other element or "electrically coupled" or "electrically connected" to the other element through a third element. In addition, unless explicitly described to the contrary, the word "comprise" and variations such as "comprises" or "comprising" will be understood to imply the inclusion of stated elements but not the exclusion of any other elements.

A display device including a static electricity discharge circuit according to an exemplary embodiment of the present invention will be described with reference to FIG. 1 and FIG. 2.

Figure 2:
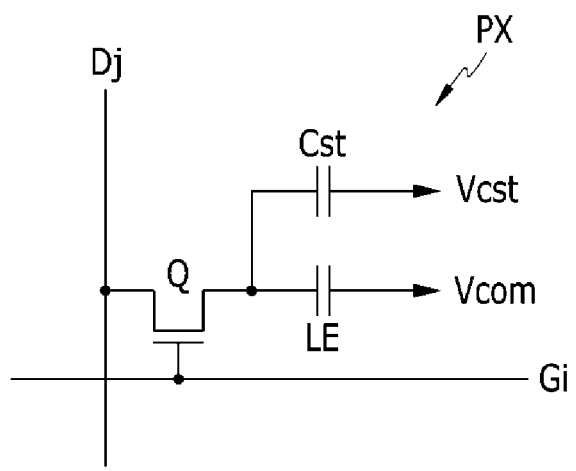
FIG. 2 is a schematic circuit diagram of one pixel of a display device according to an exemplary embodiment of the present invention.

FIG. 1 is a block diagram of a display device according to an exemplary embodiment of the present invention, and FIG. 2 is a schematic circuit diagram of one pixel of a display device according to an exemplary embodiment of the present invention.

Referring to FIG. 1, a display device according to an exemplary embodiment of the present invention includes a thin film transistor array panel 300 and a gate driver 400 and a data driver 500 connected thereto, and a signal controller 600 controlling them.

The thin film transistor array panel 300 includes a display area DA that is a region displaying an image and a peripheral area PA disposed adjacent to the display area DA.

A plurality of pixels PX are connected to a plurality of signal lines G1-Gn and D1-Dm and arranged in a matrix are disposed in the display area DA.

The signal lines G1-Gn and D1-Dm include a plurality of gate lines G1-Gn transmitting gate signals (also referred to as "scanning signals") and a plurality of data lines D1-Dm transmitting data signals.

Referring to FIG. 2, one pixel PX may include at least one switching element Q and a display element LE and a storage capacitor Cst connected thereto.

The switching element Q may include at least one thin film transistor connected to the signal lines G1-Gn and D1-Dm. For example, at least one thin film transistor may be connected to at least one gate line Gi (i=1, 2, . . . , n) and at least one data line Dj (j=1, 2, . . . , m).

The display element LE may include a pixel electrode (not shown) receiving a data voltage through the switching element Q, and an opposed electrode (not shown) facing the pixel electrode and receiving a common voltage Vcom. For example, in a case of a liquid crystal display, the display element LE may be a liquid crystal capacitor having the pixel electrode and the opposed electrode as two terminals, while in a case of an organic light emitting device, the display element LE may be an organic light emitting element. A photoelectric conversion element (not shown) such as a liquid crystal layer or an emission layer may be disposed between the pixel electrode and the opposed electrode.

The storage capacitor Cst is connected to the display element LE, enabling the circuit to maintain the data voltage charged to the display element LE during remaining frames. One terminal of the storage capacitor Cst is connected to the display element LE, and the other terminal may be applied with a storage common voltage Vcst. The storage capacitor Cst may be omitted.

The signal lines G1-Gn and D1-Dm may extend in the peripheral area PA of the thin film transistor array panel 300.

The signal controller 600 outputs a gate control signal CONT1 to the gate driver 400 and a data control signal CONT2 and a digital image signal DAT to the data driver 500, and thereby controls the gate driver 400 and the data driver 500 by generating the gate control signal CONT1, the data control signal CONT2, and the digital image signal DAT.

The gate driver 400 is connected to the gate lines G1-Gn. The gate driver 400 applies a gate signal, which includes a combination of a gate-on voltage Von and a gate-off voltage Voff, to the gate lines G1-Gn according to the gate control signal CONT1 from the signal controller 600.

The data driver 500 is connected to the data lines D1-Dm of the thin film transistor array panel 300. The data driver 500 receives the data control signal CONT2 from the signal controller 600 and a digital image signal DAT for the pixel PX of one row, and may select a gray voltage corresponding to each digital image signal DAT to convert the digital image signal DAT into an analog data signal. The data driver 500 applies the converted digital image signal DAT to the corresponding data lines D1-Dm.

The switching element may be turned on if the gate-on voltage Von is applied to the gate lines G1-Gn connected thereto, and the data signal applied to the data lines D1-Dm is applied to the corresponding pixel PX through the turned-on switching element.

A driving device, including the gate driver 400, the data driver 500, and the signal controller 600, can be directly mounted at the peripheral area PA of the thin film transistor array panel 300 in the form of at least one integrated circuit (IC) chip. Alternatively, the driving device may be mounted on a flexible printed circuit film (not shown) and attached to the peripheral area PA in the form of the tape carrier package TCP, or can be mounted on an additional printed circuit board PCB (not shown). Alternatively, at least a portion of the driving device may be integrated at the peripheral area PA of the thin film transistor array panel 300 together with the signal lines G1-Gn and D1-Dm and the thin film transistor.

FIG. 1 is an example in which the gate driver 400 is integrated at the peripheral area PA of the thin film transistor array panel 300. The gate driver 400, functioning substantially as a shift register, includes a plurality of driving circuits respectively connected to the gate lines G1-Gn. The driving circuits of the gate driver 400 are formed during the same process as the switching element of the pixel PX to be integrated on the thin film transistor array panel 300.

Differently from the exemplary embodiment shown in FIG. 1, the gate driver 400 may be positioned at the peripheral area PA of both sides with respect to the display area DA.

Referring to FIG. 1, at least one of signal wires STL_a and STL_b transmitting various signals may be positioned at the peripheral area PA of the thin film transistor array panel 300. For example, the signal wires STL_a and STL_b may be storage signal wires transmitting the storage common voltage Vcst to the display area DA. The signal wires STL_a and STL_b may be connected to the printed circuit film or the printed circuit board PCB where the data driver 500 or the signal controller 600 are positioned, thereby receiving the storage common voltage.

The signal wires STL_a and STL_b may be disposed in the peripheral area PA of both sides with respect to the display area DA, respectively, as shown in FIG. 1. One of the two signal wires STL_a and STL_b may be omitted. The signal wires STL_a and STL_b may be connected to each other.

At least one of the signal wires STL_a and STL_b is positioned between the gate driver 400 and the display area DA. Alternatively, and contrasting the exemplary embodiment shown in FIG. 1, the signal wires STL_a and STL_b may be disposed continuously along the edge of the display area DA, thereby substantially forming a closed line.

The signal wires STL_a and STL_b may cross at least a portion of the signal lines G1-Gn and D1-Dm while overlapping them in certain places.

Referring to FIG. 1, at least one static electricity discharge circuit unit (ESD) is disposed in the peripheral area PA of the thin film transistor array panel 300.

The static electricity discharge circuit unit (ESD) is disposed near the signal wires STL_a and STL_b and is connected to the signal wires STL_a and STL_b. The static electricity discharge circuit unit (ESD) may disperse the static electricity inflowed through the signal wires STL_a and STL_b. Additionally or alternatively, the static electricity discharge circuit unit ESD may block the static electricity from flowing into other wires such as the signal lines G1-Gn and Dl-Dm or the driving circuit integrated on the thin film transistor array panel 300, thereby preventing other wires such as the signal lines G1-Gn and Dl-Dm or the various elements integrated on the thin film transistor array panel 300, such as the driving circuit, from being damaged.

A display device including the static electricity discharge circuit unit (ESD) according to an exemplary embodiment of the present invention will be described with reference to FIG. 3 and FIG. 4 as well as the described drawings.

Figure 3:
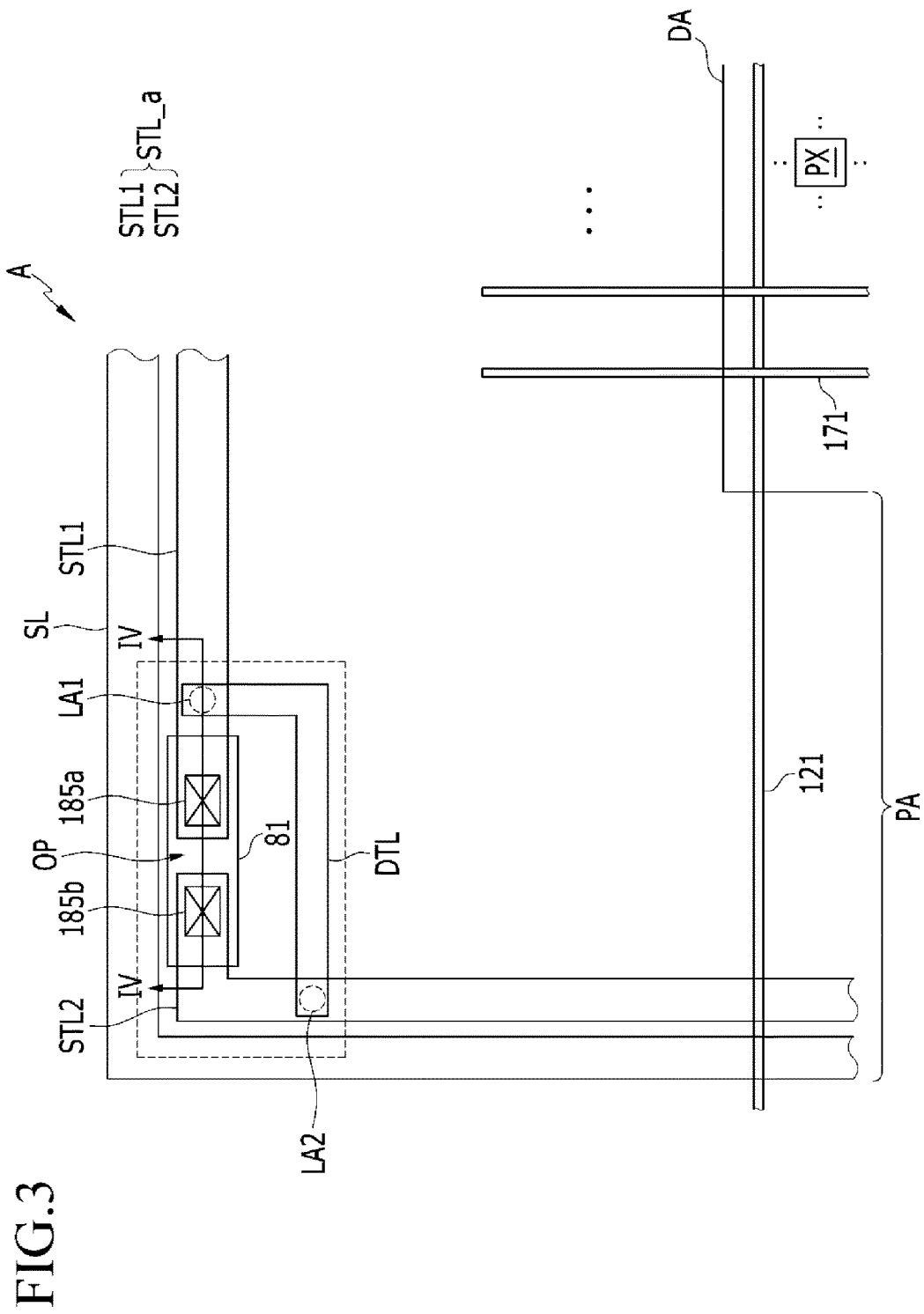
FIG. 3 is a layout view of one region A of a thin film transistor array panel of the display device shown in FIG. 1.
Figure 4:
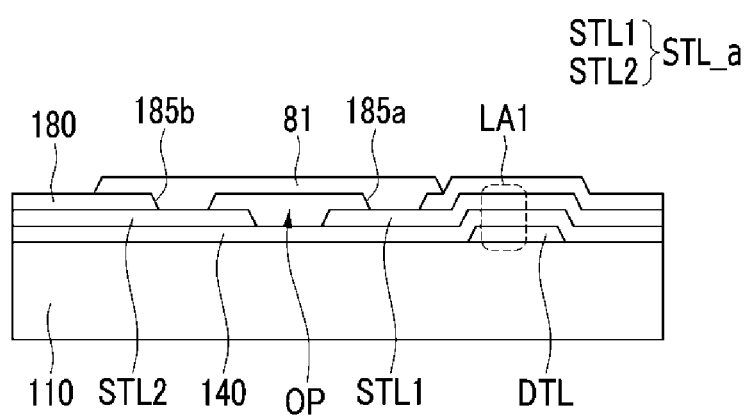
FIG. 4 is a cross-sectional view of the display device of FIG. 3 taken along the line IV-IV.

FIG. 3 is a layout view of a region A of a thin film transistor array panel of a display device shown in FIG. 1, and FIG. 4 is a cross-sectional view of the display device of FIG. 3 taken along the line IV-IV.

Referring to FIG. 3 and FIG. 4, a plurality of pixels PX, a plurality of gate lines 121, and a plurality of data lines 171 are positioned in the display area DA of the thin film transistor array panel 300. The plurality of pixels PX may be approximately arranged in a matrix. The data lines 171 may extend in a substantially columnar direction and the gate lines 121 may mainly extend substantially parallel to a row direction. The gate lines 121 and the data lines 171 may be insulated and cross one another. The gate lines 121 and the data lines 171 are positioned on an insulation substrate 110 of the thin film transistor array panel 300.

A driving signal wire SL transmitting the driving signals, such as a scanning start signal, a gate clock signal, and a driving voltage, to the gate driver 400, and at least one signal wire STL_a, are disposed on the insulation substrate 110 of the peripheral area PA. The signal wire STL_a may be a storage signal wire transmitting the storage common voltage Vcst.

The signal wire STL_a includes a first portion STL1 and a second portion STL2 that are divided and physically separated from each other in the separation space OP. The first portion STL1 and the second portion STL2 may be made of the same material and may be disposed in the same layer. An end portion of the first portion STL1 and an end portion of the second portion STL2 are disposed opposite to each other. Particularly, the second portion STL2 includes a portion intersecting the gate line 121 connected to the gate driver 400.

An insulating layer 180 is positioned on the first portion STL1 and the second portion STL2 of the signal wire STL_a. The insulating layer 180 may include an insulating material such as an inorganic insulator or an organic insulator. The insulating layer 180 has a contact hole 185*a* exposing the first portion STL1 and a contact hole 185*b* exposing the second portion STL2. The separation space OP is between the two contact holes 185*a* and 185*b*.

A connecting member 81 is positioned on the insulating layer 180. The connecting member 81 is physically and electrically connected with the first portion STL1 of the signal wire STL_a and the second portion STL2 at the contact holes 185*a* and 185*b*, and electrically connects the first portion STL1 and the second portion STL2. The connecting member 81 may be made of a transparent conductive material such as indium tin oxide (ITO) or indium zinc oxide (IZO), aluminum, silver, chromium, and or alloys thereof.

As described above, if the portion of the signal wire STL_a is connected as a bridge type through the connecting member 81 of the different layer from the signal wire STL_a, resistance of the signal wire STL_a is increased such that the static electricity inflow into the signal wire STL_a may be reduced.

Since the resistance is increased near the separation space OP of the signal wire STL_a, the static electricity inflowed through the signal wire STL_a and particularly the first portion STL1, may be prevented from flowing into the second portion STL2, which intersects the gate line 121. Accordingly, a static electric burn defect caused by the static electricity is prevented from being generated in the crossing region of the second portion STL2 and the gate line 121. Additionally or alternatively, the electrical elements of the gate driver 400 are prevented from being damaged by the inflow of the static electricity into the gate line 121.

As described above, the portion connecting the portion of the signal wire STL_a as the bridge type through the connecting member 81 of the different layer from the signal wire STL_a may reduce the static electricity inflow, disperse the inflowed static electricity, or block it from flowing to the other elements, thereby being included in the static electricity discharge circuit unit (ESD).

The static electricity discharge circuit unit (ESD) according to an exemplary embodiment of the present invention may further include a detour path (DTL).

Referring to FIG. 3 and FIG. 4, the detour path DTL includes a portion overlapping a portion of the first portion STL1 in an overlapping region LA1, a portion overlapping a portion of the second portion STL2 in an overlapping region LA2, and a wire portion connecting between the two overlapping regions LA1 and LA2 and extending. The two overlapping regions LA1 and LA2 are disposed near the separation space OP of the signal wire STL_a.

The detour path DTL is disposed at a different layer from the signal wire STL_a and is insulated from the signal wire STL_a. For example, referring to FIG. 4, the detour path DTL may be disposed between the signal wire STL_a and the insulation substrate 110, and an insulating layer 140 may be disposed between the detour path DTL and the signal wire STL_a. The detour path DTL may be disposed in the same layer as the gate line 121 of the display area DA. In this case, the signal wire STL_a may be disposed in the same layer as the data line 171, but it is not limited thereto.

The detour path DTL is insulated from the signal wire STL_a in a normal state, but when the connecting member 81 is damaged and disconnected by the inflowed static electricity, a laser may be radiated to the overlapping regions LA1 and LA2 to connect the first portion STL1 of the signal wire STL_a and the second portion STL2 to the detour path DTL. Accordingly, if the connecting member 81 becomes disconnected, the first portion STL1 of the signal wire STL_a and the second portion STL2 can be electrically connected to each other through the detour path DTL.

A display device including the static electricity discharge circuit unit (ESD) according to an exemplary embodiment of the present invention will be described with reference to FIG. 5 to FIG. 9.

Figure 5:
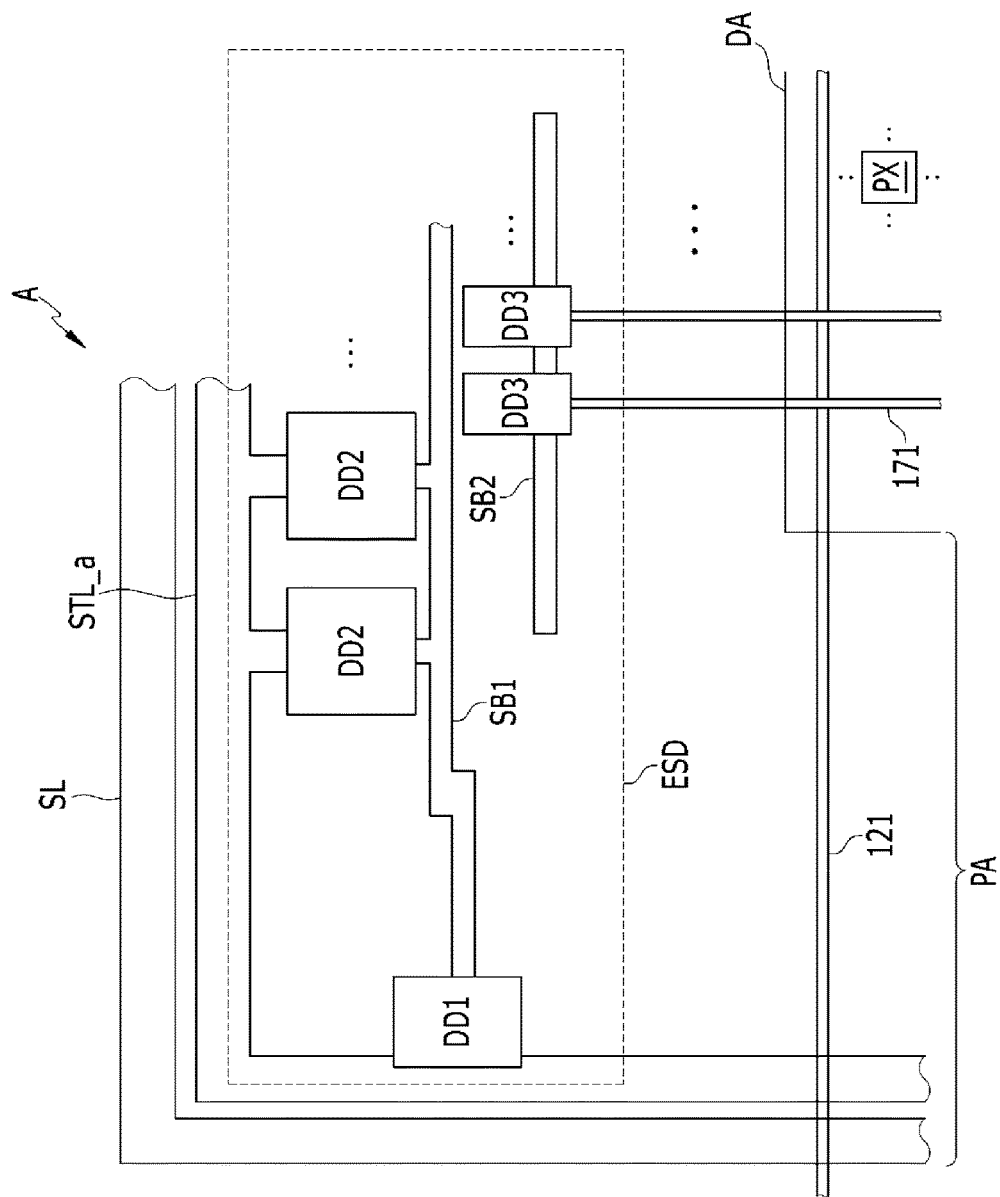
FIG. 5 is a layout view of one region of a thin film transistor array panel of a display device according to an exemplary embodiment of the present invention.
Figure 6:
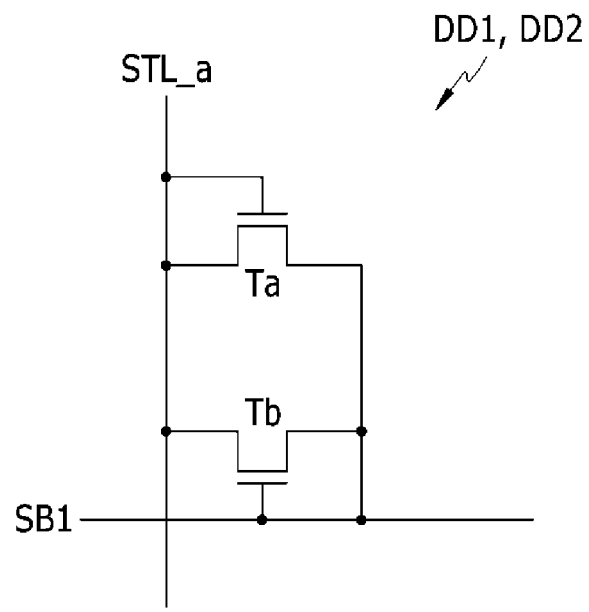
FIG. 6 and FIG. 7 are respectively circuit diagrams of a static electricity discharge diode part included in a display device according to an exemplary embodiment of the present invention.
Figure 7:
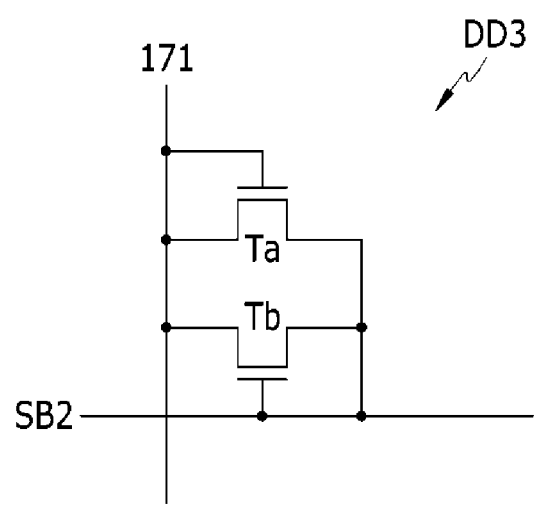
Figure 8:
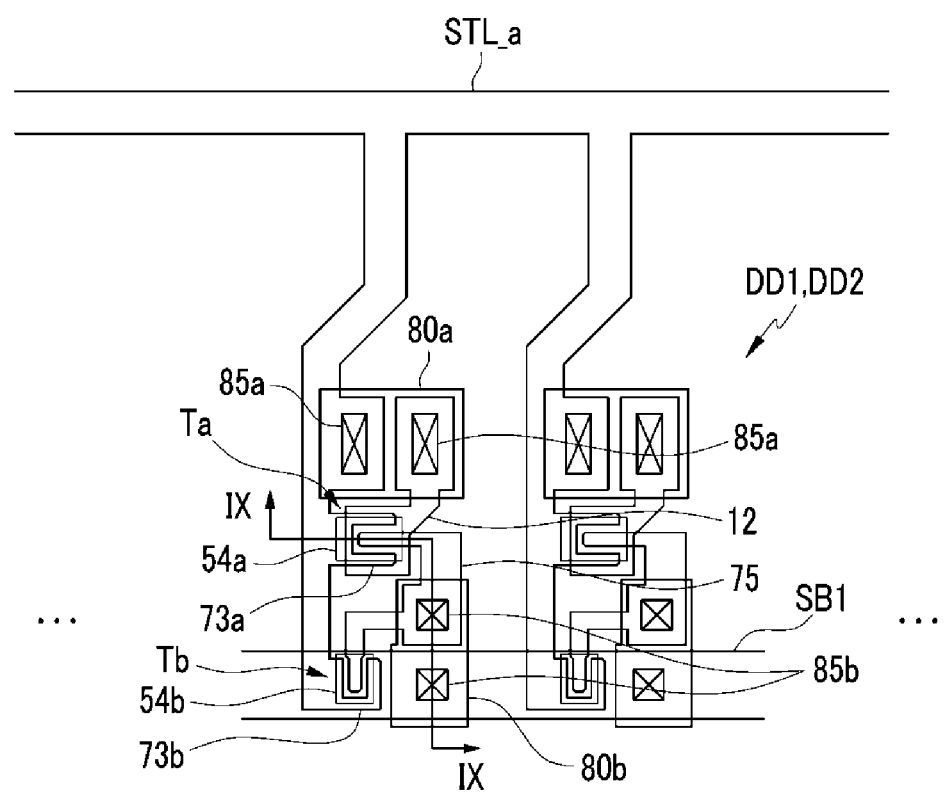
FIG. 8 is a layout view of a static electricity discharge diode part included in a display device according to an exemplary embodiment of the present invention.
Figure 9:
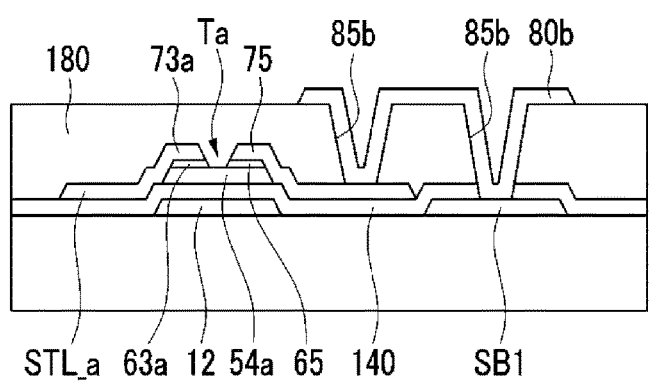
FIG. 9 is a cross-sectional view of the display device of FIG. 8 taken along the line IX-IX.

FIG. 5 is a layout view of one region of a thin film transistor array panel of a display device according to an exemplary embodiment of the present invention, FIG. 6 and FIG. 7 are respectively circuit diagrams of a static electricity discharge diode part included in a display device according to an exemplary embodiment of the present invention, FIG. 8 is a layout view of a static electricity discharge diode part included in a display device according to an exemplary embodiment of the present invention, and FIG. 9 is a cross-sectional view of the display device of FIG. 8 taken along the line IX-IX.

The display device according to the present exemplary embodiment substantially identical to the previously described exemplary embodiment, however, the static electricity discharge circuit unit (ESD) may further include a static electricity discharge diode part. Features identical to those in the previous embodiments will not be repeated in the interest of efficiency.

Referring to FIG. 5, the static electricity discharge diode part includes a plurality of static electricity discharge diodes DD1 and DD2 and at least one shorting bar SB1 connected thereto.

The shorting bar SB1 may extend substantially parallel to a row direction and may be provided in plural. A plurality of shorting bars may extend to be parallel to each other. The shorting bar SB1 extends to the signal wire STL_b of the peripheral area PA opposite to the thin film transistor array panel 300, thereby being connected to the signal wire STL_b. A plurality of static electricity discharge diodes DD1 and DD2 may be connected to each shorting bar SB1, respectively.

Referring to FIG. 6, the static electricity discharge diodes DD1 and DD2 according to an exemplary embodiment of the present invention may respectively include a first discharge transistor Ta and a second discharge transistor Tb.

A control terminal and an input terminal of the first discharge transistor Ta are connected to the signal wire STL_a, and an output terminal is connected to the shorting bar SB1. The input terminal of the second discharge transistor Tb is connected to the signal wire STL_a, and the control terminal and the output terminal are connected to the shorting bar SB1.

When the static electricity flows to the signal wire STL_a, the voltage more than a threshold voltage is applied to the first discharge transistor Ta included in the static electricity discharge diodes DD1 and DD2, so the first discharge transistor Ta is turned on. The static electricity may then be transmitted and dispersed to the shorting bar SB1 through the first discharge transistor Ta. If the static electricity transmitted to the shorting bar SB1 is accumulated, the second discharge transistor Tb of the other of static electricity discharge diodes DD1 and DD2 connected to the shorting bar SB1 may be turned on, and the accumulated static electricity may be dispersed into another portion of the signal wire STL_a through the turned-on second discharge transistor Tb.

As described above, according to an exemplary embodiment of the present invention, although the static electricity flows into the signal wire STL_a, the static electricity is dispersed or absorbed through the static electricity discharge diode part, thereby blocking the generation of the burn defect in the crossing region of the signal wire STL_a and the gate line 121 and preventing the static electricity inflow to the driving circuit of the gate driver 400. Also, before the main electric elements of the thin film transistor array panel 300 are damaged by the static electricity, the static electricity discharge diodes DD1 and DD2 are damaged first such that the main circuit may be protected.

The number of static electricity discharge diodes DD1 and DD2 may be controlled to increase a dispersion effect of the static electricity. Particularly, the static electricity discharge diode DD2 may be arranged in plural according to the signal wire STL_a in the row direction, thereby improving space utilization and increasing the dispersion effect of the static electricity.

Referring to FIG. 5 and FIG. 7, the static electricity discharge diode part according to the present exemplary embodiment may further include a plurality of static electricity discharge diodes DD3 connected to the data line 171 and at least one shorting bar SB2 connected thereto.

When a plurality of shorting bars SB2 extend substantially parallel to the row direction, they may be extended to be parallel to each other.

Referring to FIG. 7, the static electricity discharge diode DD3 according to an exemplary embodiment of the present invention may have a similar structure as the static electricity discharge diodes DD1 and DD2. In particular, the static electricity discharge diode DD3 may respectively include the first discharge transistor Ta and the second discharge transistor Tb.

The control terminal and the input terminal of the first discharge transistor Ta are connected to the data line 171, and the output terminal is connected to the shorting bar SB2. The input terminal of the second discharge transistor Tb is connected to the data line 171, and the control terminal and the output terminal are connected to the shorting bar SB2.

While the static electricity flows into the data line 171, if a voltage more than the threshold voltage is applied to the first discharge transistor Ta included in the static electricity discharge diode DD3 connected to the data line 171, the first discharge transistor Ta is turned on, and the static electricity is transmitted to the shorting bar SB2 through the first discharge transistor Ta to be dispersed. If the static electricity transmitted to the shorting bar SB2 is accumulated, the second discharge transistor Tb connected to the other data line 171 connected to the shorting bar SB2 may be turned on and the static electricity may be dispersed into the other data line 171 through the turned-on second discharge transistor Tb.

As described above, according to an exemplary embodiment of the present invention, although the static electricity flows into the data line 171, the static electricity is dispersed or absorbed through the static electricity discharge diode DD3 thereby protecting the data line 171 and preventing the static electricity from flowing into the display area DA. Also, before the data line 171 or an electrical element connected thereto is damaged by the static electricity, the static electricity discharge diode DD3 is firstly damaged such that the data line 171 or the electric element connected thereto may be protected.

According to an exemplary embodiment of the present invention, the shorting bar SB1 and the static electricity discharge diode DD2 are not connected to the shorting bar SB2 or the static electricity discharge diode DD3 such that the static electricity discharge diode DD3 is not burnt and the static electricity does not flow into the data line 171 by the static electricity flowing through the signal wire STL_a. Accordingly, when displaying the image, signal leakage is not generated through the data line 171 such that stains, such as vertical lines, are not recognized, and the damage to the thin film transistor connected to the data line 171 by the static electricity may be prevented.

An example of a detailed structure of the static electricity discharge diodes DD1 and DD2 will be described with reference to FIG. 8 and FIG. 9. Referring to FIG. 8 and FIG. 9, a plurality of gate conductors including a plurality of discharge control electrodes 12 and at least one shorting bar SB1 are disposed on the insulation substrate 110. The discharge control electrodes 12 are electrically and physically separated from the shorting bar SB1.

The insulating layer 140 made of, for example, silicon nitride or silicon oxide, is disposed on the gate conductor.

A first semiconductor 54a and a second semiconductor 54b are disposed on the insulating layer 140. The first semiconductor 54a is disposed on the discharge control electrode 12 and the second semiconductor 54b is disposed on the shorting bar SB1. The first and second semiconductors 54a and 54b may be made of amorphous silicon, polysilicon, or an oxide semiconductor.

A pair of ohmic contacts 63a and 65 may be positioned on the first semiconductor 54a, and a pair of ohmic contacts (not shown) may be positioned on the second semiconductor 54b. The ohmic contacts 63a and 65 may be made of, for example, n+ hydrogenated amorphous silicon heavily doped with an n-type impurity such as phosphorous.

The signal wire STL_a and a first drain electrode 75 are positioned on the ohmic contacts 63a and 65 and the insulating layer 140.

The signal wire STL_a may transmit the storage common voltage Vcst and may extend substantially parallel to the row direction. The signal wire STL_a includes a first input electrode 73a extending toward the discharge control electrode 12, and at least one second input electrode 73b extending along the shorting bar SB1.

The first drain electrode 75 is separated from the signal wire STL_a. Both ends of the first drain electrode 75 face the first and second input electrodes 73a and 73b with respect to the first and second semiconductors 54a and 54b.

The discharge control electrode 12, the first input electrode 73a, and the first drain electrode 75 form the first discharge transistor Ta along with the first semiconductor 54a. The shorting bar SB1, the second input electrode 73b, and the first drain electrode 75 form the second discharge transistor Tb along with the second semiconductor 54b.

The insulating layer 180 is positioned on the signal wire STL_a and the first drain electrode 75.

The insulating layers 140 and 180 have a contact hole 85a respectively exposing the signal wire STL_a and the discharge control electrode 12, and a contact hole 85b respectively exposing the first drain electrode 75 and the shorting bar SB1.

A plurality of connecting members 80a and 80b are disposed on the insulating layer 180. The connecting member 80a is electrically connected to the signal wire STL_a and the discharge control electrode 12 through the contact hole 85a. The connecting member 80b is electrically connected to the first drain electrode 75 and the shorting bar SB1 through the contact hole 85b.

Although not shown, the structure of the static electricity discharge diode DD3 may be the same as the structure of the static electricity discharge diodes DD1 and DD2 shown in FIG. 8 and FIG. 9.

A display device including the static electricity discharge circuit unit (ESD) according to an exemplary embodiment of the present invention will be described with reference to FIG. 10 and FIG. 11 along with the described drawings.

Figure 10:
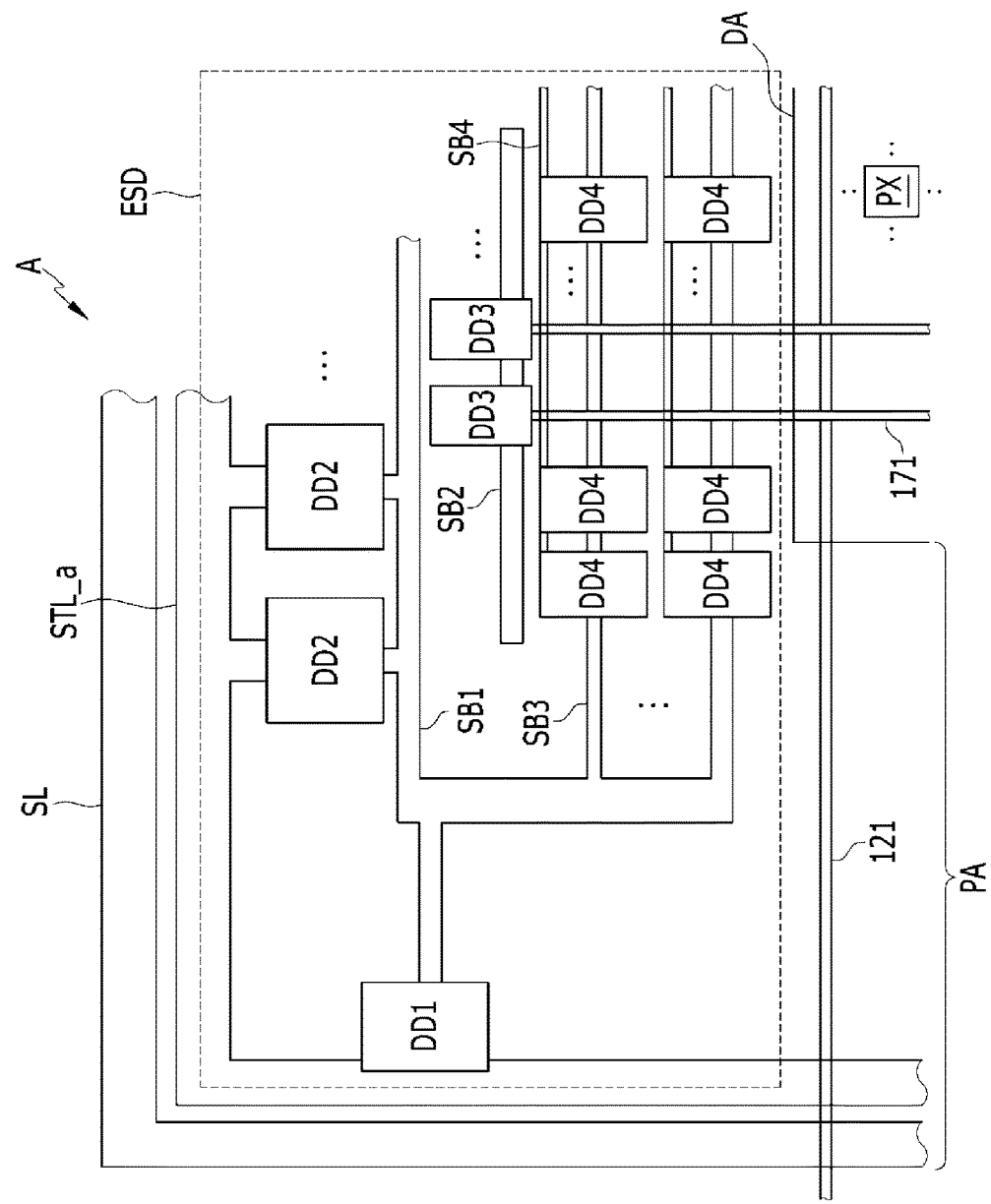
FIG. 10 is a layout view of one region of a thin film transistor array panel of a display device according to an exemplary embodiment of the present invention.
Figure 11:
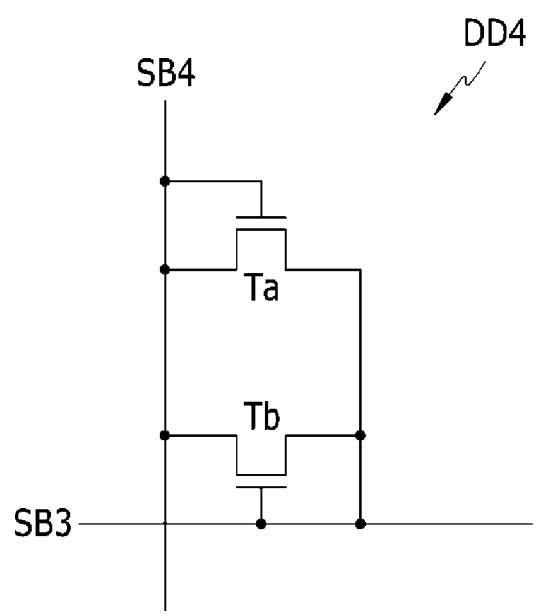
FIG. 11 is a circuit diagram of a static electricity discharge diode part included in a display device according to an exemplary embodiment of the present invention.

FIG. 10 is a layout view of one region of a thin film transistor array panel of a display device according to an exemplary embodiment of the present invention, and FIG. 11 is a circuit diagram of a static electricity discharge diode part included in a display device according to an exemplary embodiment of the present invention.

The display device according to the present exemplary embodiment is substantially the same as the exemplary embodiment shown in FIG. 5 to FIG. 9. However, in the present embodiment, the static electricity discharge circuit unit (ESD) may further include a plurality of static electricity discharge diodes DD4 and at least one shorting bar SB3 and SB4 connected thereto to increase the dispersion effect of the static electricity. Thus, structures identical to those in previous embodiments will be omitted in the interest of efficiency.

The shorting bars SB3 and SB4 may extend substantially parallel to the row direction and may be approximately parallel to the shorting bar SB1. A plurality of shorting bars SB3 and SB4 may be provided to increase the dispersion of the static electricity. The shorting bar SB3 is connected to the shorting bar SB1, and the shorting bar SB4 is not directly connected to the shorting bar SB1.

At least one of the shorting bar SB3 and the shorting bar SB4 may extend to the signal wire STL_b of the peripheral area PA opposite the thin film transistor array panel 300 to be connected to the static electricity discharge diode DD1, which is in turn connected to the signal wire STL_a.

A plurality of static electricity discharge diodes DD4 may be connected to each shorting bar SB3, and a plurality of static electricity discharge diodes DD4 connected to one shorting bar SB3 may be connected to one shorting bar SB4. A plurality of static electricity discharge diodes DD4 connected to one shorting bar SB3 may be arranged in rows.

Referring to FIG. 11, the static electricity discharge diode DD4 according to an exemplary embodiment of the present invention may have a similar structure as the described static electricity discharge diodes DD1 and DD2. In detail, the static electricity discharge diode DD4 may respectively include the first discharge transistor Ta and the second discharge transistor Tb.

The control terminal and the input terminal of the first discharge transistor Ta are connected to the shorting bar SB4, and the output terminal is connected to the shorting bar SB3. The input terminal of the second discharge transistor Tb is connected to the shorting bar SB4, and the control terminal and the output terminal are connected to the shorting bar SB3.

If the static electricity inflowed to the signal wire STL_a flows to the shorting bar SB1 through the static electricity discharge diodes DD1 and DD2, the static electricity may flow to the shorting bar SB3 connected to the shorting bar SB1. If a voltage more than the threshold voltage is applied to the second discharge transistor Tb included in the static electricity discharge diode DD4, by the static electricity inflowed to the shorting bar SB3, the second discharge transistor Tb is turned on and the static electricity is transmitted to the shorting bar SB4 through the second discharge transistor Tb and dispersed. If the static electricity transmitted to the shorting bar SB4 is accumulated, the first discharge transistor Ta of the other static electricity discharge diode DD4 may be turned on.

The structure of the static electricity discharge diode DD4 may be similar to the structure of the static electricity discharge diodes DD1 and DD2 shown in FIG. 8 and FIG. 9.

As described above, according to an exemplary embodiment of the present invention, although the static electricity inflows to the signal wire STL_a, the static electricity is dispersed or absorbed through the static electricity discharge diodes DD1, DD2, and DD4 such that the burn defect may be prevented at the crossing of the signal wire STL_a and the gate line 121, and static electricity inflow into the driving circuit of the gate driver 400 may be prevented. Also, before the main electrical elements of the thin film transistor array panel 300 are damaged by the static electricity, the static electricity discharge diode DD4 is firstly damaged, along with the static electricity discharge diodes DD1 and DD2, thereby protecting the main circuit.

Next, a display device including the static electricity discharge circuit unit (ESD) according to an exemplary embodiment of the present invention will be described with reference to FIG. 12 along with the described drawings.

Figure 12:
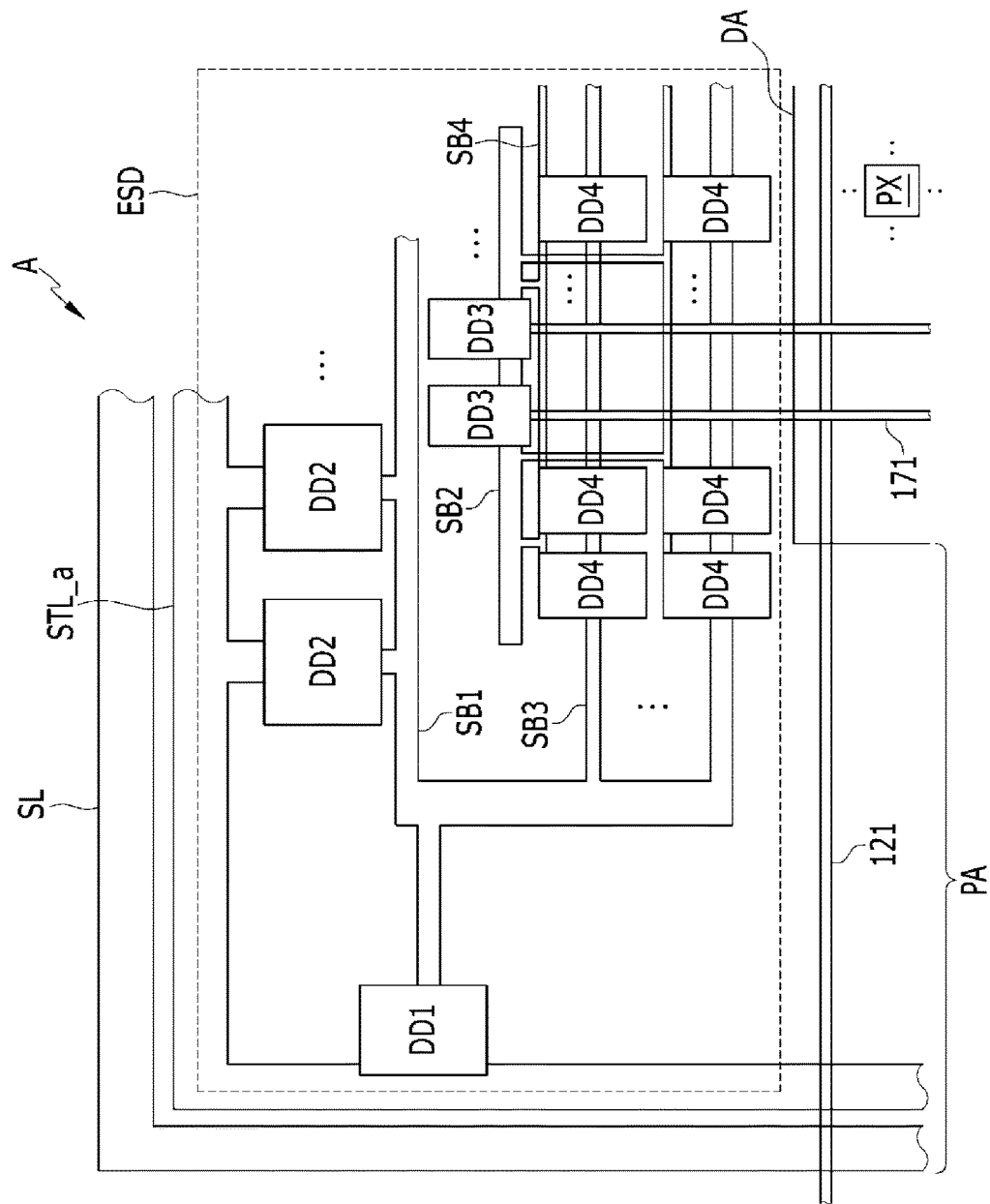
FIG. 12 and FIG. 13 are respectively layout views of one region of a thin film transistor array panel of a display device according to an exemplary embodiment of the present invention.

FIG. 12 is a layout view of one region of a thin film transistor array panel of a display device according to an exemplary embodiment of the present invention.

The display device according to the present exemplary embodiment is substantially the same as the exemplary embodiment shown in FIG. 10 and FIG. 11. However, in the current embodiment, the shorting bar SB4 connected to the static electricity discharge diode DD4 may be connected to the shorting bar SB2, which is in turn connected to the static electricity discharge diode DD3. Accordingly, the dispersion effect of the static electricity by the static electricity discharge diode DD3 and DD4 may be further improved.

A display device including the static electricity discharge circuit unit (ESD) according to an exemplary embodiment of the present invention will be described with reference to FIG. 13 along with the described drawings.

Figure 13:
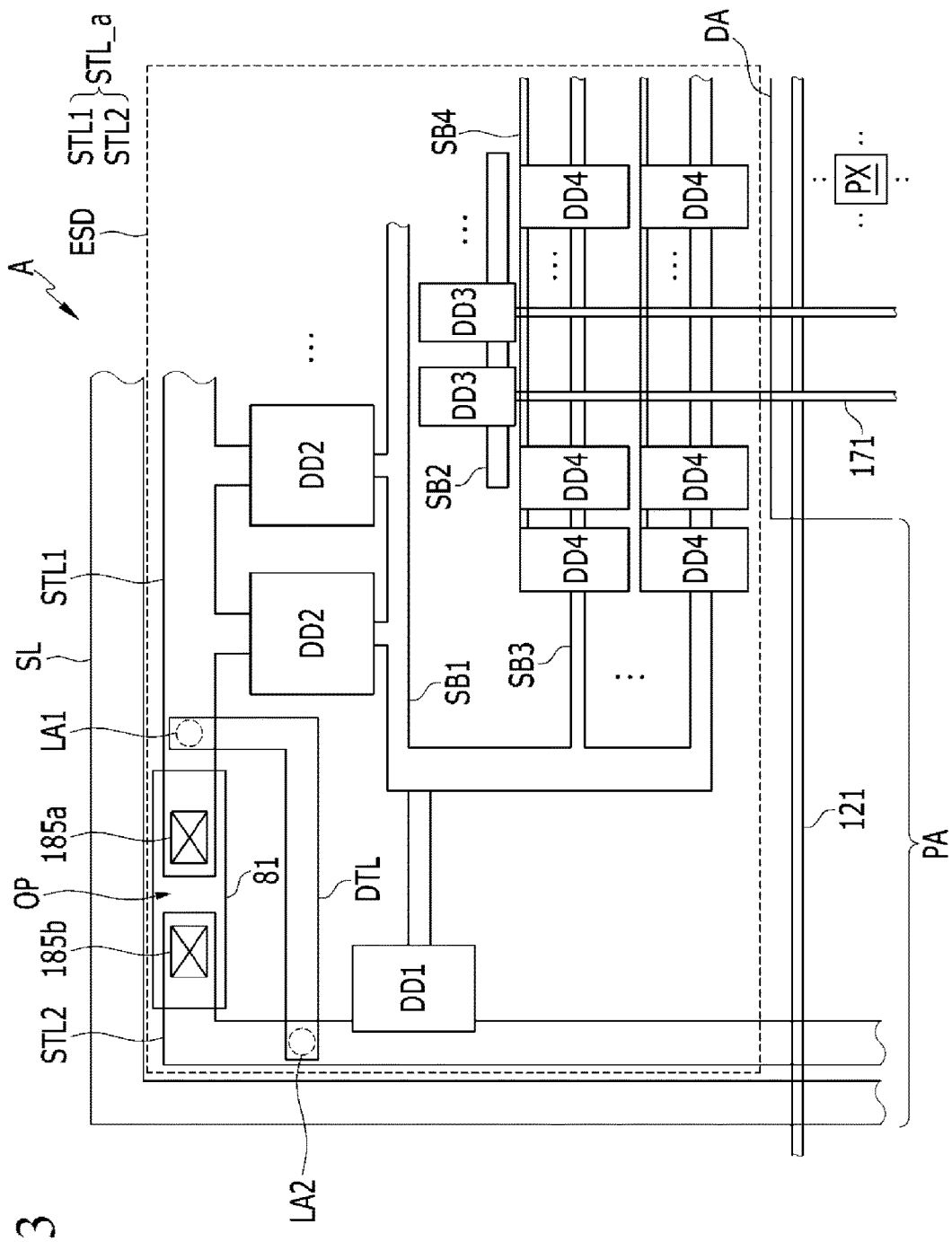

FIG. 13 is a layout view of one region of a thin film transistor array panel of a display device according to an exemplary embodiment of the present invention.

The display device according to an exemplary embodiment of the present invention may simultaneously include characteristics of at least two exemplary embodiments among the several exemplary embodiments shown in FIG. 3 to FIG. 12. FIG. 13 is an example that in which static electricity discharge circuit unit (ESD) of the display device according to an exemplary embodiment of the present invention simultaneously includes the various characteristics of the exemplary embodiments shown in FIG. 3 to FIG. 11. However, the invention is not limited thereto and can include any combination of the exemplary embodiments. For example, SB2 may be connected to SB14, as is shown in FIG. 12.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
   a thin film transistor array panel comprising a display area having a plurality of pixels and a peripheral area outside the display area;
   a signal wire disposed in the peripheral area; and
   a static electricity discharge circuit unit disposed in the peripheral area and electrically connected to the signal wire,
   wherein the static electricity discharge circuit comprises:
      a plurality of first static electricity discharge diodes, each of the plurality of first static electricity discharge diodes electrically connected to the signal wire,
      a first shorting bar electrically connected to the plurality of first static electricity discharge diodes,
      a second shorting bar directly connected to the first shorting bar and substantially parallel to the first shorting bar, and
      a plurality of second static electricity discharge diodes, each of the plurality of second static electricity discharge diodes electrically connected to the second shorting bar.

2. The display device of claim 1, further comprising:
   a plurality of gate lines and a plurality of data lines, each of the plurality of gate lines and plurality of data lines electrically connected to switching elements disposed in the pixels, wherein the first shorting bar is disposed substantially parallel to a gate line.

3. The display device of claim 2, wherein each of the plurality of first static electricity discharge diodes is disposed in a line along the first shorting bar.

4. The display device of claim 1, wherein the static electricity discharge circuit unit further comprises:
   a fourth shorting bar electrically connected to the plurality of second static electricity discharge diodes.

5. The display device of claim 4, wherein the fourth shorting bar is disposed substantially parallel to the first shorting bar.

6. The display device of claim 1, wherein each of the plurality of second static electricity discharge diodes is disposed in a line along the second shorting bar.

7. The display device of claim 6, further comprising:
   a plurality of gate lines and a plurality of data lines, each of the plurality of gate lines and plurality of data lines electrically connected to switching elements disposed in the pixels;
   a third static electricity discharge diode electrically connected to a data line; and
   a third shorting bar electrically connected to the third static electricity discharge diode, wherein the second shorting bar is electrically connected to the third shorting bar.

* * * * *